United States Patent
Isobe

(10) Patent No.: US 9,620,560 B2
(45) Date of Patent: Apr. 11, 2017

(54) EL DISPLAY DEVICE AND METHOD FOR MANUFACTURING SAME

(75) Inventor: Takashi Isobe, Nara (JP)

(73) Assignee: JOLED INC., Tokyo (JP)

( * ) Notice: Subject to any disclaimer, the term of this patent is extended or adjusted under 35 U.S.C. 154(b) by 60 days.

(21) Appl. No.: 14/131,801

(22) PCT Filed: Aug. 24, 2012

(86) PCT No.: PCT/JP2012/005323
§ 371 (c)(1),
(2), (4) Date: Jan. 9, 2014

(87) PCT Pub. No.: WO2013/031162
PCT Pub. Date: Mar. 7, 2013

(65) Prior Publication Data
US 2014/0159074 A1 Jun. 12, 2014

(30) Foreign Application Priority Data

Aug. 26, 2011 (JP) .................................. 2011-184349

(51) Int. Cl.
*H01L 27/15* (2006.01)
*H01L 33/44* (2010.01)
(Continued)

(52) U.S. Cl.
CPC ........ *H01L 27/156* (2013.01); *H01L 27/1262* (2013.01); *H01L 27/3246* (2013.01);
(Continued)

(58) Field of Classification Search
CPC .............. H01L 27/1262; H01L 27/156; H01L 27/3288; H01L 33/44; H01L 51/5234; H01L 51/5253; H01L 27/3246; H05B 33/26
See application file for complete search history.

(56) References Cited

U.S. PATENT DOCUMENTS 5,443,922 A 8/1995 Nishizaki et al.
7,230,271 B2 * 6/2007 Yamazaki ........... H01L 51/5259
257/59
(Continued)

FOREIGN PATENT DOCUMENTS

JP 05-163488 6/1993
JP 2004-164902 6/2004
(Continued)

OTHER PUBLICATIONS

U.S. Appl. No. 14/131,439 to Kosuke Mishima et al., filed Jan. 8, 2014.
(Continued)

*Primary Examiner* — A. Sefer
*Assistant Examiner* — Benjamin Tzu-Hung Liu
(74) *Attorney, Agent, or Firm* — Greenblum & Bernstein, P.L.C.

(57) ABSTRACT

An EL display device of the present invention includes a plurality of pixel electrodes, wiring, a common electrode, a plurality of light-emitting layer portions, and a protective layer. The pixel electrodes are formed in one-to-one correspondence with a plurality of pixels. The wiring is formed in at least one of a plurality of intervals between the pixels. The common electrode is formed above each of the pixel electrodes and is in electrical connection with the wiring. The common electrode is made of alkali metal or alkaline earth metal. The light-emitting layer portions are each located between a corresponding one of the pixel electrodes and the common electrode. The protective layer is located on the common electrode, preventing oxidization thereof. The EL display device suppresses voltage drop in the common electrode, while also suppressing reduction in a property of electron injection to the light-emitting layer portions.

21 Claims, 10 Drawing Sheets

(51) Int. Cl.
  *H01L 27/12* (2006.01)
  *H01L 27/32* (2006.01)
  *H01L 51/52* (2006.01)
  *H05B 33/26* (2006.01)
(52) U.S. Cl.
  CPC .......... *H01L 27/3288* (2013.01); *H01L 33/44* (2013.01); *H01L 51/5234* (2013.01); *H01L 51/5253* (2013.01); *H05B 33/26* (2013.01)

(56) References Cited

U.S. PATENT DOCUMENTS

| | | | |
|---|---|---|---|
| 2007/0029929 A1* | 2/2007 | Nakamura | H01L 27/3276 313/506 |
| 2008/0284323 A1 | 11/2008 | Kashiwabara et al. | |
| 2010/0102310 A1* | 4/2010 | Komatsu | H01L 51/5088 257/43 |
| 2012/0319090 A1 | 12/2012 | Shinkai et al. | |

FOREIGN PATENT DOCUMENTS

| | | |
|---|---|---|
| JP | 2007-073499 | 3/2007 |
| JP | 2008-305557 | 12/2008 |
| JP | 2009-218220 | 9/2009 |
| JP | 2011-040167 | 2/2011 |
| JP | 2011-108527 | 6/2011 |
| JP | 2011-154795 | 8/2011 |

OTHER PUBLICATIONS

International Search Report (ISR) in International Patent Application No. PCT/JP2012/005323, dated Sep. 18, 2012.

* cited by examiner

EL DISPLAY DEVICE AND METHOD FOR MANUFACTURING SAME

TECHNICAL FIELD

The present invention relates to an electroluminescence (EL) display device in which a light-emitting layer is located between a plurality of pixel electrodes, which are each located in a corresponding one of a plurality of pixels, and a common electrode which is common to all of the pixels. In particular, the present invention relates to an EL display device including wiring for supplying electrical power to the common electrode (referred to below as electrical supply wiring).

BACKGROUND ART

In a typical EL display device, a common electrode is located continuously throughout a plurality of pixels located on a substrate. An electrical voltage is applied to a portion of a light-emitting layer in each of the pixels, via the common electrode, from a periphery of the substrate. Consequently, due to electrical resistance of the common electrode, there is a tendency for electrical voltage applied to light-emitting layer portions in a central region of the substrate to be reduced relative to electrical voltage applied to light-emitting layer portions in a peripheral region of the substrate. As a consequence, uneven luminance of the light-emitting layer portions occurs between different pixels.

In one strategy for preventing a problem of voltage drop in the common electrode, electrical supply wiring is provided having stable conductivity across all of the light-emitting layer portions, and electrical power is supplied to the common electrode via the electrical supply wiring. The above configuration suppresses inequalities between the light-emitting layer portions in terms of applied electrical voltage.

FIG. 10 is a cross-sectional diagram illustrating a top-emission display device disclosed in Patent Literature 1 as one example of the EL display device including the electrical supply wiring. A display device 1000 includes a substrate 1001, a first electrode 1002 that functions as a pixel electrode, electrical supply wiring 1003, a hole injection layer 1004, a bank 1005, a light-emitting layer 1006, an electron transport layer 1007, and a second electrode 1008 that functions as a common electrode.

The first electrode 1002 and the electrical supply wiring 1003 are located on the substrate 1001 with an interval therebetween. The bank 1005 is located between the first electrode 1002 and the electrical supply wiring 1003.

The hole injection layer 1004, the light-emitting layer 1006, the electron transport layer 1007 and the second electrode 1008 are located above the first electrode 1002 in respective order. The display device 1000 is a top-emission display device. Therefore, the second electrode 1008 is for example made of a transparent conductive material such as indium tin oxide (ITO). ITO has a weak property of electron injection to the light-emitting layer 1006 compared to an alkali metal for example. Therefore, the electron transport layer 1007 is included between the second electrode 1008 and the light-emitting layer 1006. The electron transport layer 1007 is for example made of an organic material doped with alkali metal or alkaline earth metal (also referred to below as an organic electron transport layer). The property of electron injection can be improved through the doping with alkali metal or alkaline earth metal.

On the other hand, the second electrode 1008 is located above the electrical supply wiring 1003 with the electron transport layer 1007 therebetween. The electrical supply wiring 1003 is electrically connected to the second electrode 1008 through the above configuration.

CITATION LIST

Patent Literature

[Patent Literature 1] Japanese Patent Application Publication No. 2011-40167

SUMMARY OF INVENTION

Technical Problem

In a configuration in which the electron transport layer 1007 and the second electrode 1008, which form an electron injection structure, are configured by a layered structure of an organic electron transport layer and an ITO layer, a problem of increasing contact resistance between the electrical supply wiring 1003 and the second electrode 1008 may occur.

One strategy which has been considered in order to avoid increasing contact resistance is through a configuration in which the electrical supply wiring 1003 and the second electrode 1008 are in direct contact, without the electron transport layer 1007 located therebetween. Unfortunately, in the above configuration a problem of reduction in the property of electron injection to the light-emitting layer 1006 may occur.

The present invention was achieved in consideration of the above problem, and an aim thereof is to provide an EL display device and a method for manufacturing the same, which suppresses voltage drop in a common electrode while also suppressing reduction in a property of electron injection to a light-emitting layer.

Solution to Problem

In order to solve the above problem, in one aspect of the present invention an EL display device comprises: a substrate; a plurality of pixel electrodes located on the substrate with intervals therebetween; wiring located on the substrate in at least one of the intervals between the pixel electrodes; a plurality of light-emitting layer portions, each located on or above a corresponding one of the pixel electrodes in electrical connection therewith; a common electrode located on or above the light-emitting layer portions, and in electrical connection with the light emitting layer portions and the wiring; and a protective layer located on or above the common electrode, and preventing oxidization of the common electrode, wherein the common electrode is made of alkali metal or alkaline earth metal.

Advantageous Effects of Invention

In the EL display device relating to one aspect of the present invention, the common electrode is made of alkali metal or alkaline earth metal. Through the above configuration, formation of alkali metal oxide or alkaline earth metal oxide between the common electrode and the wiring, which conventionally occurs due to ITO, can be prevented. Therefore, the above configuration enables low contact resistance to be maintained between the common electrode and the wiring, and thus enables reduction in a property of electron injection to the light-emitting layer portions to be suppressed.

Furthermore, an alkali metal or alkaline earth metal has a lower work function compared to an oxide conductor. Therefore, forming the common electrode from alkali metal or alkaline earth metal enables improvement of the property of electron injection to the light-emitting layer portions.

BRIEF DESCRIPTION OF DRAWINGS

FIG. 8 is a partial cross-sectional diagram that schematically illustrates configuration of an EL display panel 10a.

DESCRIPTION OF EMBODIMENTS

<Background Leading to Invention>

Figure 1:
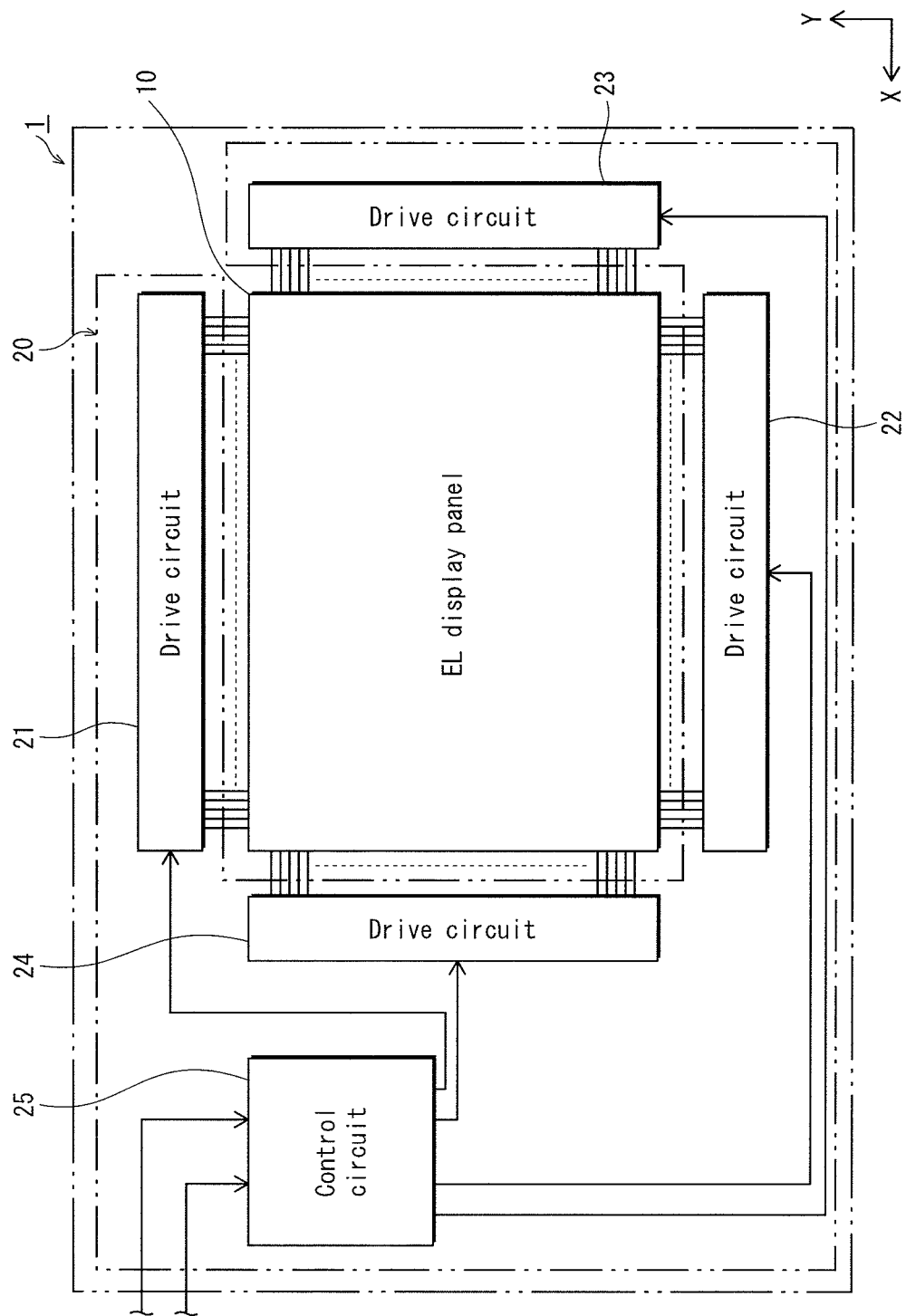
FIG. 1 is a block diagram that schematically illustrates overall configuration of an EL display device 1.

The inventor considered reasoning as to why increasing contact resistance between the electrical supply wiring 1003 and the second electrode 1008 occurs in the conventional art, when the electron transport layer 1007 and the second electrode 1008, which form an electron injection structure, are configured by a layered structure of an organic electron transport layer and an ITO layer.

The inventor considered the reason for the above to be that alkali metal or alkaline earth metal doped in the organic electron transport layer strips oxygen from ITO, which is an oxide, at an interface between the organic electron transport layer and the ITO layer. Alkali metal oxide or alkaline earth metal oxide formed as a result of the above is an insulator, and thus causes increased contact resistance between the electrical supply wiring 1003 and the second electrode 1008. As a consequence, an amount of electrical power supplied to the second electrode 1008 from the electrical supply wiring 1003 is decreased, which makes it difficult to effectively suppress the problem of voltage drop in the second electrode 1008.

After dedicated investigation of the problems described above, the inventor achieved the EL display device and the method for manufacturing the same in the present invention, which suppress voltage drop in a common electrode while also suppressing reduction in a property of electron injection to a light-emitting layer.

Embodiments

In one aspect of the present invention, an EL display device comprises: a substrate; a plurality of pixel electrodes located on the substrate with intervals therebetween; wiring located on the substrate in at least one of the intervals between the pixel electrodes; a plurality of light-emitting layer portions, each located on or above a corresponding one of the pixel electrodes in electrical connection therewith; a common electrode located on or above the light-emitting layer portions, and in electrical connection with the light emitting layer portions and the wiring; and a protective layer located on or above the common electrode, and preventing oxidization of the common electrode, wherein the common electrode is made of alkali metal or alkaline earth metal.

Alternatively, in another aspect of the present invention the EL display device may further comprise an intermediate layer including alkali metal or alkaline earth metal, located between the light-emitting layer portions and the common electrode.

Alternatively, in another aspect of the present invention the wiring and the pixel electrodes may be located on a same surface of the substrate, and the intermediate layer may be also located on or above the wiring.

Alternatively, in another aspect of the present invention the intermediate layer may be made of a base material doped with alkali metal or alkaline earth metal, the base material being an organic material having an electron transport property.

Alternatively, in another aspect of the present invention the intermediate layer may have an alkali metal concentration or an alkaline earth metal concentration of at least 10% by weight.

Alternatively, in another aspect of the present invention the protective layer may have a multi-layer structure including a plurality of sub-layers, and a lowermost sub-layer of the protective layer may be made of an organic material.

Alternatively, in another aspect of the present invention, in the protective layer, an oxidized protective sub-layer made of alkali metal oxide or alkaline earth metal oxide may be located on the lowermost sub-layer.

Alternatively, in another aspect of the present invention, in the protective layer, a sealing sub-layer may be located on the oxidized protective sub-layer.

Alternatively, in another aspect of the present invention the EL display device may further comprise a metal oxide layer including a transition metal, located between each of the pixel electrodes and a corresponding one of the light-emitting layer portions.

Alternatively, in another aspect of the present invention the EL display device may further comprise a metal oxide layer including a transition metal, located between each of the pixel electrodes and a corresponding one of the light-emitting layer portions, wherein the metal oxide layer may be also located between the wiring and the intermediate layer.

Alternatively, in another aspect of the present invention the transition metal may be at least one selected from the group consisting of Mo, W, Ti, In, Sn and Zn.

In one aspect of the present invention, a method for manufacturing an EL display device comprises: forming an insulating layer on a TFT substrate; forming a plurality of pixel electrodes and wiring on the insulating layer, separated from one another with intervals therebetween; forming banks on a surface of the insulating layer, such that first openings are formed between the banks in locations corresponding to the pixel electrodes and a second opening is formed between the banks in a location corresponding to the wiring; forming a light-emitting layer portion on or above each of the pixel electrodes, which are each exposed externally from between the banks through a corresponding one of the first openings; forming a common electrode using alkali metal or alkaline earth metal, on or above each of the light-emitting layer portions and on or above the wiring, which is exposed externally from between the banks through the second opening; and forming a protective layer that prevents oxidization of the common electrode on or above the common electrode.

Alternatively, in another aspect of the present invention the method for manufacturing an EL display device may further comprise forming a hole injection layer on or above the pixel electrodes and the wiring layer, after the forming of the pixel electrodes and the wiring, and before the forming of the banks.

Alternatively, in another aspect of the present invention the hole injection layer may include an oxide of at least one selected from the group consisting of Mo, W, Ti, In, Sn and Zn.

Alternatively, in another aspect of the present invention the method for manufacturing an EL display device may further comprise forming an intermediate layer including alkali metal or alkaline earth metal on or above the light-emitting layer portions and on or above a region of the hole injection layer exposed externally from between the banks through the second opening, after the forming of the light-emitting layer portions, and before the forming of the common electrode.

Alternatively, in another aspect of the present invention, in the forming of the intermediate layer, the intermediate layer may be formed from a base material doped with alkali metal or alkaline earth metal, the base material being an organic material having an electron transport property.

Alternatively, in another aspect of the present invention, in the forming of the intermediate layer, the intermediate layer may be formed such that an alkali metal concentration or an alkaline earth metal concentration of the intermediate layer is at least 10% by weight.

Alternatively, in another aspect of the present invention the hole injection layer and the intermediate layer may be each formed continuously in and between each of the first openings and the second opening.

Alternatively, in another aspect of the present invention the protective layer may have a multi-layer structure including a plurality of sub-layers, and in the forming of the protective layer, an organic material sub-layer may be formed on or above the common electrode as a lowermost sub-layer of the protective layer.

Alternatively, in another aspect of the present invention, in the forming of the protective layer, an oxidized protective sub-layer made of alkali metal oxide or alkaline earth metal oxide may be formed on the organic material sub-layer.

Alternatively, in another aspect of the present invention, in the forming of the protective layer, a sealing sub-layer may be formed on the oxidized protective sub-layer.

First Embodiment (Overall Configuration of EL Display Device 1)

FIG. 1 is a block diagram that schematically illustrates overall configuration of an EL display device 1. The EL display device 1 includes an EL display panel 10 and a drive controller 20 which is connected to the EL display panel 10.

The EL display panel 10 is for example a top-emission organic EL display panel which uses electroluminescence of an organic material.

The drive controller 20 includes four drive circuits 21-24 and a control circuit 25.

In the EL display device 1, in terms of positioning of the drive controller 20 relative to the EL display panel 10, the drive controller 20 is not limited to being located surrounding four sides of the EL display panel 10 as illustrated in FIG. 1.

(Configuration of EL Display Panel 10)

Figure 2:
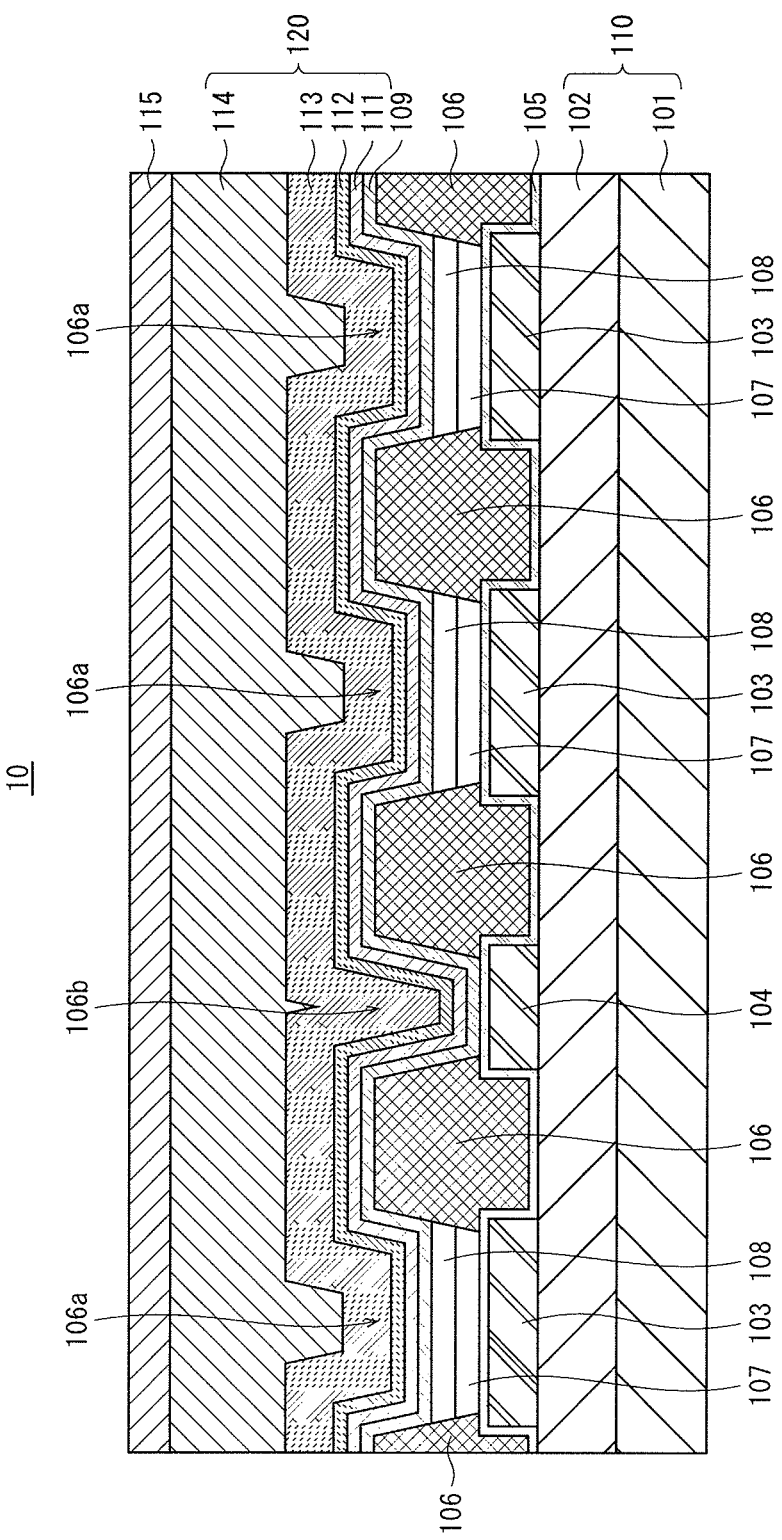
FIG. 2 is a partial cross-sectional diagram that schematically illustrates configuration of an EL display panel 10.

FIG. 2 is a partial cross-sectional diagram that schematically illustrates configuration of the EL display panel 10. FIG. 2 schematically illustrates one part of the EL display panel 10. The EL display panel 10 includes a thin film transistor (TFT) substrate 101, an inter-layer insulating film 102, pixel electrodes 103, electrical supply wiring 104, a hole injection layer 105, banks 106, a hole transport layer composed of a plurality of hole transport layer portions 107, a light-emitting layer composed of a plurality of light-emitting layer portions 108, a common electrode 109, a protective layer 120, and sealing glass 115. In the EL display panel 10, a plurality of pixels are located in positions corresponding one-to-one to a plurality of first openings 106a. Each of the pixels has a layered structure configured by the TFT substrate 101, the inter-layer insulating film 102, a corresponding one of the pixel electrodes 103, the hole injection layer 105, a corresponding one of the hole transport layer portions 107, a corresponding one of the light-emitting layer portions 108, the common electrode 109, the protective layer 120, and the sealing glass 115. In the EL display panel 10, the pixels are arranged in a matrix (in a direction X and a direction Y in FIG. 1) on a surface of the TFT substrate 101.

The following explains each of the configuration elements of the EL display panel 10 in detail.

[TFT Substrate 101]

The TFT substrate 101 has a configuration in which a TFT, wiring, and a passivation film covering the TFT are formed on a substrate base material. The TFT may for example be a TFT in which silicon is used as a channel material, a TFT in which an oxide semiconductor such as indium gallium zinc oxide is used, or a TFT in which an organic semiconductor such as pentacene is used. The substrate base material is an insulating material such as non-alkali glass, soda glass, non-fluorescent glass, phosphate glass, borate glass, quartz, acrylic resin, styrene resin, polycarbonate resin, epoxy resin, polyethylene, polyester, silicone resin, or alumina. Alternatively, the substrate base material may be an organic resin film.

[Inter-Layer Insulating Film 102]

The inter-layer insulating film 102 covers a surface of the TFT substrate 101. The inter-layer insulating film 102 is made of an insulating material such as a polyimide resin or acrylic resin. In the present Description, the TFT substrate 101 and the inter-layer insulating film 102 located thereon are referred to collectively as a substrate 110.

[Pixel Electrodes 103]

Each of the pixel electrodes 103 is a first electrode of a corresponding one of the pixels, and in the present embodiment each of the pixel electrodes 103 functions as an anode. No particular limitation is placed on material used to form the pixel electrodes 103, but in a configuration for top-emission, preferably the pixel electrodes 103 should be made of a light-reflecting material. Preferable materials include metals, conductive oxides and conductive polymers. The metal may for example be aluminum, silver alloy, molybdenum, tungsten, titanium, chromium, nickel, zinc, or an alloy thereof. The conductive oxide may for example be ITO, indium zinc oxide or zinc oxide. The conductive polymer may for example be polyaniline or polythiophene, or may be a mixture of polyaniline or polythiophene with an acidic substance or a basic substance.

[Electrical Supply Wiring 104]

The electrical supply wiring 104 is provided in order to suppress voltage drop in the common electrode 109. In the EL display panel 10, the electrical supply wiring 104 is located on the same surface of the substrate 110 (surface of the inter-layer insulating film 102) as the pixel electrodes 103, with intervals therebetween.

Preferably the electrical supply wiring 104 should be made of a material having a stable conductive property, and may for example be made of the same material as the pixel electrodes 103. As illustrated in FIG. 2, the electrical supply wiring 104 is located in an interval between adjacent pixels (in a region corresponding to a second opening 106b). The electrical supply wiring 104 may for example be located in all of the intervals between adjacent pixels, or alternatively may only be located in some of the intervals, such as between adjacent pluralities of pixels.

[Hole Injection Layer 105]

The hole injection layer 105 has a function of injecting holes from each of the pixel electrodes 103 into a corresponding one of the light-emitting layer portions 108. In the EL display panel 10, the hole injection layer 105 is provided over the entire surface of the inter-layer insulating film 102 such as to cover the pixel electrodes 103 and the electrical supply wiring 104. The hole injection layer 105 is made of metal oxide including at least one transition metal from among Mo, W, Ti, In, Sn and Zn. The metal oxide may for example include a transition metal oxide such as tungsten oxide ($WO_x$), molybdenum oxide ($MoO_x$), or molybdenum tungsten oxide ($Mo_xW_yO_z$). Alternatively, the hole injection layer 105 may for example be made of polypyrrole, polyaniline, PEDOT, PSS, or SAM.

[Banks 106]

The banks 106 are formed on a surface of the hole injection layer 105 such that the first openings 106a are formed therebetween in locations corresponding to the pixel electrodes 103, and the second opening 106b is formed therebetween in a location corresponding to the electrical supply wiring 104. The pixel electrodes 103 are each exposed externally from between the banks 106 through a corresponding one of the first openings 106a, and the electrical supply wiring 104 is exposed externally from between the banks 106 through the second opening 106b (refer to FIG. 2). The banks 106 are made of an organic insulating material such as a resin. The organic material may for example be an acrylic resin, a polyimide resin, or a novolac phenol resin. Preferably the banks 106 should be insoluble in organic solvents. Also, processing such as etching and baking is performed on the banks 106. Therefore, the banks 106 should preferably be made of a highly durable material which is not excessively deformed or altered during such processing.

[Hole Transport Layer Portions 107]

Each of the hole transport layer portions 107 is located above the hole injection layer 105 in a corresponding one of the first openings 106a. The hole transport layer portion 107 has functions such as blocking transport of electrons from a corresponding one of the light-emitting layer portions 108 to the hole injection layer 105, and efficiently transporting holes to the light-emitting layer portion 108. The hole transport layer portions 107 may for example be made of a triazole derivative, oxadiazole derivative, imidazole derivative, polyarylalkane derivative, pyrazoline derivative, pyrazolone derivative, phenylenediamine derivative, arylamine derivative, amino substituted chalcone derivative, oxazole derivative, styrylanthracene derivative, fluorenone derivative, hydrazone derivative, stilbene derivative, porphyrin compound, aromatic tertiary amine compound, styrylamine compound, butadiene compound, polystyrene derivative, triphenylmethane derivative, or tetraphenylbenzene derivative, such as disclosed in Japanese Patent Application Publication No. H5-163488. Among the above materials, use of a porphyrin compound, aromatic tertiary amine compound, or styrylamine compound is particularly preferable.

[Light-Emitting Layer Portions 108]

Each of the light-emitting layer portions 108 is located in a corresponding one of the first openings 106a. The light-emitting layer portion 108 is located above the hole transport layer portion 107, and thus is in electrical connection with the pixel electrode 103 via the hole transport layer portion 107 and the hole injection layer 105. The light-emitting layer portion 108 has a function of emitting light through recombination of holes supplied from a side corresponding to the pixel electrode 103 and electrons supplied from a side corresponding to the common electrode 109.

The light-emitting layer portions 108 can be configured as an organic light-emitting layer. In a configuration in which the light-emitting layer portions 108 are an organic light-emitting layer, the light-emitting layer portions 108 can be made of a fluorescent polymer such as a polyfluorene, polyphenylene vinylene, polyacetylene, polyphenylene, polyparaphenylene ethylene, poly-3-hexylthiophene, or a derivative of any of the aforementioned polymers. Alternatively, the light-emitting layer portions 108 may be made of a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound, azaquinolone compound, pyrazoline derivative, pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, or rare earth metal complex, as disclosed in Japanese Patent Application Publication No. H5-163488.

[Common Electrode 109]

The common electrode 109 is a second electrode of each of the pixels, and in the present embodiment the common electrode 109 functions as a cathode. The common electrode is located on surfaces of the light-emitting layer portions 108 and the banks 106. The common electrode 109 is in electrical connection with each of the light-emitting layer portions 108 and is common to all of the light-emitting layer portions 108. As illustrated in FIG. 2, the common electrode 109 is in contact with the hole injection layer 105, and the hole injection layer 105 is in contact with the electrical supply wiring 104. Therefore, the electrical supply wiring 104 and the common electrode 109 are in electrical connection with one another.

The common electrode 109 is made of alkali metal or alkaline earth metal. More specifically, the common electrode 109 is preferably made of lithium (Li), potassium (K), cesium (Cs), magnesium (Mg), calcium (Ca), strontium (Sr) or barium (Ba), with use of Ba being particularly preferable. Through use of a material such as described above, the common electrode 109 can be configured as a light-transmitting electrode.

The following explains why it is particularly preferable to use Ba as a material for the common electrode 109. (1) An injection level of Ba and a lowest unoccupied molecular orbital of each of the light-emitting layer portions 108 have similar energy levels. Consequently, a property of electron injection from the Ba to the light-emitting layer portions 108 is high due to a barrier to injection of the electrons being low. (2) Ba includes a large number of free electrons. Consequently, accumulation of holes at an interface between the Ba and each of the light-emitting layer portions 108 is eased, suppressing occurrence of localized polarization at the interface. As a result of the above, it is possible to prevent material breakdown arising due a localized strong magnetic field at the interface, which causes reduction in the property of electron injection and also in internal quantum efficiency. Furthermore, the above prevents exciton-polaron quenching, and also prevents temporary reduction in internal quantum efficiency when power is switched on. (3) From a point of view of material supply, Ba is a relatively stable material and can be handled easily during manufacture. For the reasons explained above, Ba is a preferable material for forming the common electrode 109.

[Protective Layer 120]

The protective layer 120 is located above the common electrode 109, and has a multi-layered structure including an organic material sub-layer 111, an oxidized protective sub-layer 112, a sealing sub-layer 113, and a resin sealing sub-layer 114, layered in respective order. The protective layer 120 suppresses oxidization of the common electrode 109 which is a cause of voltage drop in the common electrode 109.

The organic material sub-layer 111 is for example made of a polymer material formed from an oxadiazole derivative, such as 1,3-bis(4-tert-butylphenyl-1,3,4-oxadiazolyl)phenylene (OXD-7), an anthraquinodimethane derivative, a diphenylquinone derivative, or a silole derivative, or can alternatively be made of bis(2-methyl-8-quinolinolato)-(para-phenylphenolato) aluminum (BAlq), bathocuproine (BCP) or the like.

The oxidized protective sub-layer 112 can be made of alkali metal oxide or alkaline earth metal oxide. The oxidized protective sub-layer 112 can be formed using the same material as the common electrode 109.

The sealing sub-layer 113 has a function of preventing exposure of the light-emitting layer portions 108 and the like to moisture and air. The sealing sub-layer 113 can for example be made of silicon oxide (SiO), silicon nitride (SiN), silicon oxynitride (SiON), silicon carbide (SiC), silicon oxycarbide (SiOC), aluminum nitride (AlN), or aluminum oxide ($Al_2O_3$).

The resin sealing sub-layer 114 has a function of blocking entry of external moisture and gases. The resin sealing sub-layer 114 can be made of various different transparent resin materials such as an epoxy resin or a silicone resin.

Effects

In configuration of the EL display panel 10 in the EL display device 1, an electron injection structure is configured by a single layer structure of the common electrode 109, as opposed to by a multi-layered structure of an organic electron transport layer and an ITO layer. In the electron injection structure of the EL display device 1, alkali metal or alkaline earth metal oxidization by ITO does not occur. Therefore, the above configuration prevents formation of alkali metal oxide or alkaline earth metal oxide from occurring due to oxidization by ITO between the common electrode 109 and the electrical supply wiring 104. Consequently, low contact resistance can be maintained between the common electrode 109 and the electrical supply wiring 104, and thus reduction in the property of electron injection to the light-emitting layer portions 108 can be suppressed.

Furthermore, the common electrode 109 is made of alkali metal or alkaline earth metal, which has a low work function compared to an oxide conductor. Consequently, the configuration in which the common electrode 109 is made of alkali metal or alkaline earth metal enables improvement in the property of electron injection to the light-emitting layer portions 108.

In the EL display panel 10, the common electrode 109 is made of alkali metal or alkaline earth metal, and through the protective layer 120 located on a surface of the common electrode 109, oxidization of the common electrode 109 can be suppressed. Formation of an insulating oxide in the common electrode 109 is prevented as a result of the above, and thus a high level of conductivity can be maintained in the common electrode 109. The above configuration effectively prevents the problem of voltage drop in the common electrode 109.

(Method for Manufacturing EL Display Panel 10)

The following explains one example of a method for manufacturing the EL display panel 10.

FIGS. 3A-3D, 4A-4C, and 5A-5C are cross-sectional diagrams illustrating examples of process steps in manufacture of the EL display panel 10. FIGS. 3A-3D, 4A-4C, and 5A-5C schematically illustrate only one part of the EL display panel 10.

Figure 3A:
FIGS. 3A-3D illustrate one example of a process for manufacturing the EL display panel 10.

As illustrated in FIG. 3A, the inter-layer insulating film 102 is first formed on the TFT substrate 101.

Figure 3B:
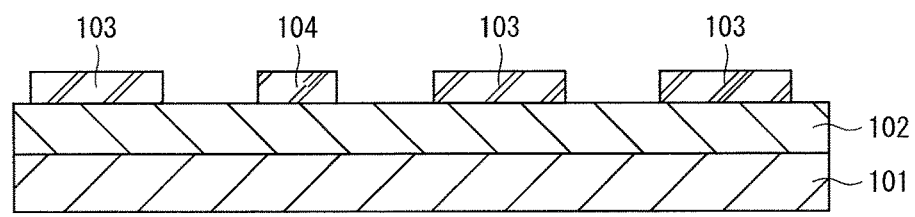

Next, a thin film of a conductive material is formed on the inter-layer insulating film 102. The thin film can for example be formed by a vacuum film formation method such as vacuum deposition or sputtering. Once the thin film has been formed, patterning of the thin film is performed by photolithography in order to form the pixel electrodes 103 and the electrical supply wiring 104, which are separated from one another with intervals therebetween as illustrated in FIG. 3B.

During the above, if the pixel electrodes 103 and the electrical supply wiring 104 are formed from the same material and are formed in different locations on the same surface of the inter-layer insulating film 102, the pixel electrodes 103 and the electrical supply wiring 104 can be formed through the same process, achieving a concise and efficient manufacturing process.

Figure 3C:
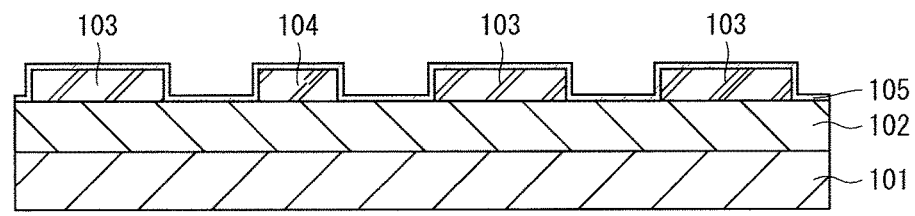

After formation of the pixel electrodes 103 and the electrical supply wiring 104, the hole injection layer 105 is formed over the entire surface of the inter-layer insulating film 102, as illustrated in FIG. 3C, such as to cover the pixel electrodes 103 and the electrical supply wiring 104. The hole injection layer 105 can be formed by a vacuum film formation method such as vacuum deposition or sputtering.

Figure 3D:
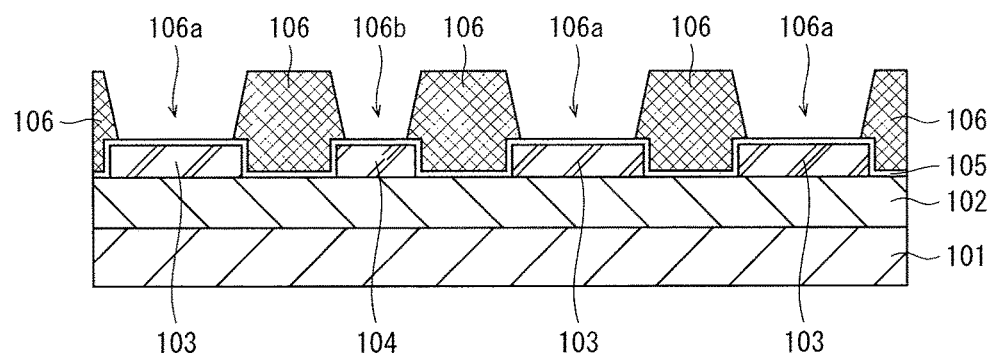

Next, a bank material layer made of an organic insulating material is formed on the hole injection layer 105. The bank material layer can for example be formed through coating of the organic insulating material. Subsequently, a mask having openings in a certain pattern is positioned above the bank material layer, and after exposure to light from above the mask, unnecessary sections of the bank material layer are washed away using a developer. The above completes patterning of the bank material layer, forming the banks 106 which surround the first openings 106a and the second opening 106b as illustrated in FIG. 3D.

Next, an inkjet method is for example used in order to drip a composite ink including a hole transport layer material onto regions of the hole injection layer 105 which are exposed externally through the first openings 106a (i.e., regions above the pixel electrodes 103). The hole transport layer portions 107 are subsequently formed through drying of the composite ink.

Figure 4A:
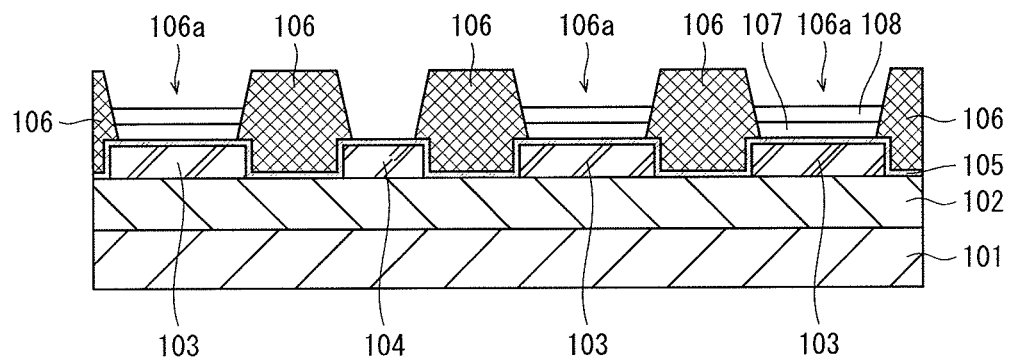
FIGS. 4A-4C illustrate subsequent parts of the process illustrated in FIGS. 3A-3D for manufacturing the EL display panel 10.

Next, an inkjet method is for example used in order to drip a composite ink including a light-emitting material onto each of the hole transport layer portions 107. The light-emitting layer portions 108 are subsequently formed through drying of the composite ink (FIG. 4A).

Figure 4B:
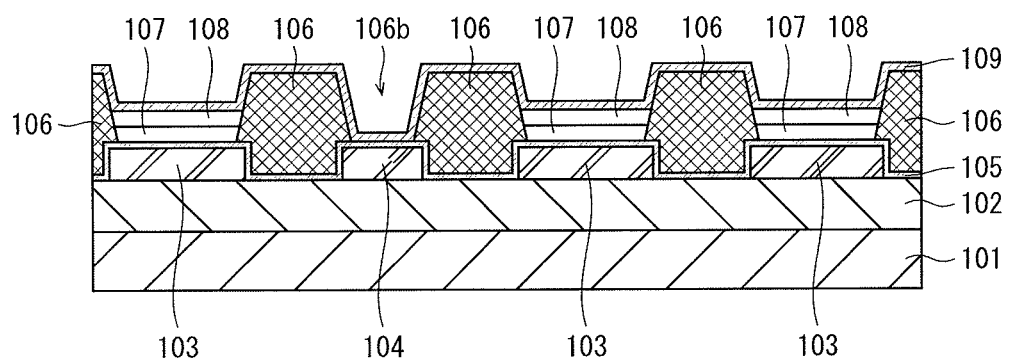

After formation of the light-emitting layer portions 108, the common electrode 109 is formed on surfaces of the light-emitting layer portions 108, surfaces of the banks 106, and a region of a surface of the hole injection layer 105 which is exposed externally through the second opening 106b (i.e., a region above the electrical supply wiring 104) (FIG. 4B). The common electrode 109 can be formed by a vacuum film formation method such as vacuum deposition or sputtering.

Figure 4C:
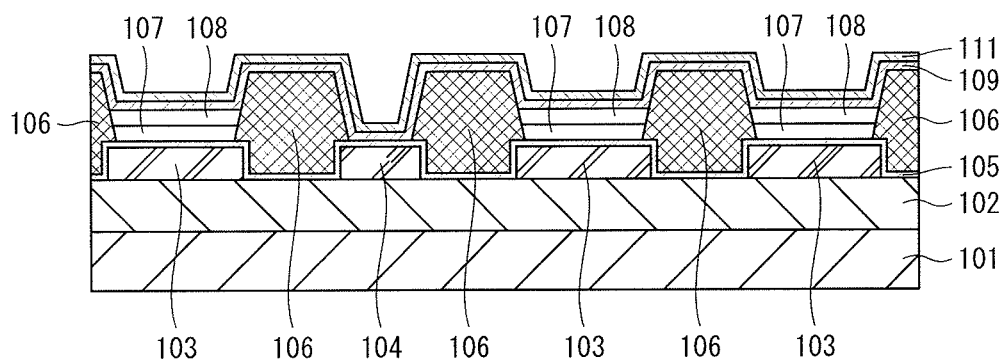

The organic material sub-layer 111 is formed over an entire surface of the common electrode 109 (FIG. 4C). The organic material sub-layer 111 can for example be formed by vacuum deposition.

Figure 5A:
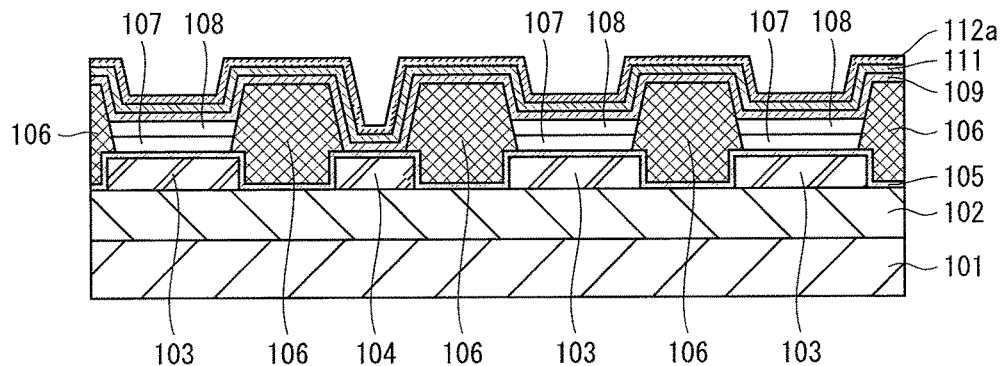
FIGS. 5A-5C illustrate subsequent parts of the process illustrated in FIGS. 4A-4C for manufacturing the EL display panel 10.

Next, an oxidizable protective material sub-layer 112a is formed over an entire surface of the organic material sub-layer 111 (FIG. 5A). The oxidizable protective material sub-layer 112a can be formed by a vacuum film formation method such as vacuum deposition or sputtering. The oxidizable protective material sub-layer 112a may be made of the same material as the common electrode 109. Through the above, cost of forming the oxidizable protective material sub-layer 112a can be reduced.

The sealing sub-layer 113 is formed over an entire surface of the oxidizable protective material sub-layer 112a. The sealing sub-layer 113 can for example be formed by chemical vapor deposition (CVD).

Figure 5B:
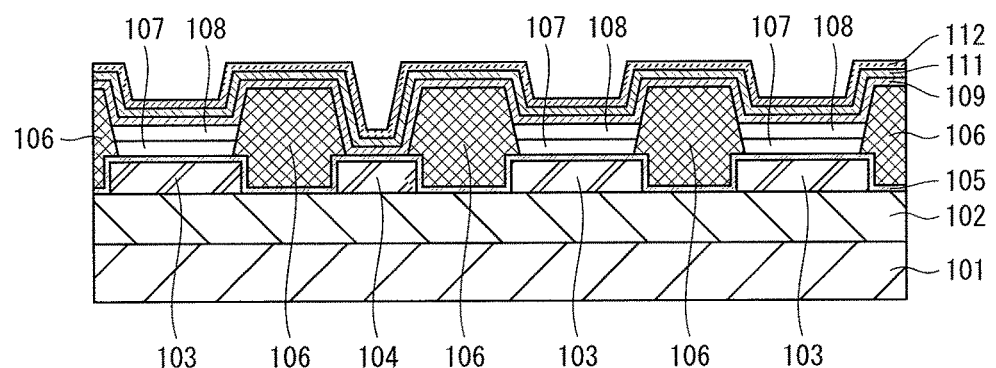

In contrast to film formation in process steps from formation of the common electrode 109 to formation of the oxidizable protective material sub-layer 112a, which are performed using a vacuum film formation method, formation of the sealing sub-layer 113 is not performed using a vacuum film formation method, and is instead performed using CVD. Consequently, spontaneous oxidization of the oxidizable protective material sub-layer 112a occurs when a vacuum state is no longer maintained during transfer, to a CVD film formation device, of an intermediate product of the EL display panel at a stage at which formation of the oxidizable protective material sub-layer 112a has been completed. As a result of the above, the oxidized protective sub-layer 112 is formed (FIG. 5B). Thus, the common electrode 109 is covered by the oxidized protective sub-layer 112. The oxidized protective sub-layer 112 is made of alkali metal oxide or alkaline earth metal oxide. Consequently, the oxidized protective sub-layer 112 is fundamentally impermeable to oxygen. By covering the common electrode 109 with the oxidized protective sub-layer 112, oxidization of the common electrode 109 can be appropriately prevented. In other words, oxidization of the oxidizable protective material sub-layer 112a is intentionally performed in order to prevent oxidization of the common electrode 109.

The following explains reasoning for formation of the organic material sub-layer 111 between the common electrode 109 and the oxidizable protective material sub-layer 112a. If film thickness of the common electrode 109 were to be simply increased in order to take into account oxidization thereof which is predicted to occur, it would not be possible to stipulate a film thickness of the common electrode 109 due to an amount of oxidization of the common electrode 109 not being accurately known. Therefore, the organic material sub-layer 111 is formed in order that film thickness of the common electrode 109 can be stipulated.

Figure 5C:
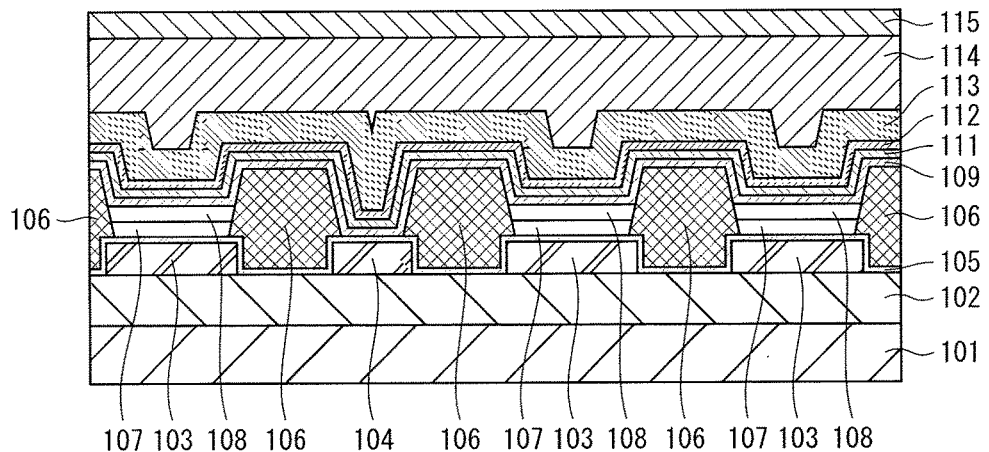

After formation of the sealing sub-layer 113 on the oxidized protective sub-layer 112, the resin sealing sub-layer 114 is formed over an entire surface of the sealing sub-layer 113. The sealing glass 115 is subsequently attached onto the resin sealing sub-layer 114 (FIG. 5C).

The EL display panel 10 is manufactured through the process described above.

(Testing)

The following explains how EL display panel properties are affected by the common electrode 109, located above the light-emitting layer portions 108, being made of alkali metal or alkaline earth metal.

[Outline of Testing]

Figure 6:
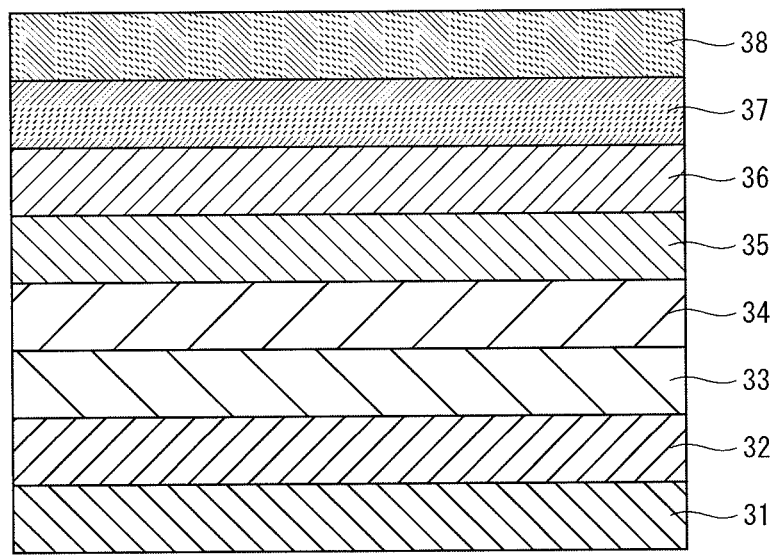
FIG. 6 is a partial cross-sectional diagram that schematically illustrates configuration of an evaluation device 30.

In order to evaluate EL display panel properties in a configuration in which the common electrode 109 is located above the light-emitting layer portions 108, a plurality of evaluation devices 30, each having a cross-sectional structure illustrated in FIG. 6, were manufactured for emission of each of red, green, and blue light.

[Evaluation Device Preparation]

As illustrated in FIG. 6, the evaluation device 30 includes a substrate 31, and layered in respective order thereon, a pixel electrode 32, a hole injection layer 33, a hole transport layer 34, a light-emitting layer 35, a Ba layer 36, an organic electron transport layer 37, and a common electrode 38.

Materials and film thicknesses of each of the layers were fundamentally the same in each of the evaluation devices. The following provides more specific explanation of the materials and film thicknesses of each of the layers. The pixel electrode 32 was made of aluminum alloy and had a film thickness of 200 nm. The hole injection layer 33 was made of tungsten oxide and had a film thickness of 5 nm. The hole transport layer 34 was made of an organic material applicable as a film by coating, and had a film thickness of 10 nm. The light-emitting layer 35 was made of an organic material applicable as a film by coating, and had a film thickness of 80 nm. The organic electron transport layer 37 was made of an organic electron transport material doped with Ba having a concentration of 5% by weight, and had a film thickness of 35 nm. The common electrode 38 was made of ITO and had a film thickness of 35 nm.

For each of R, G and B colors, three evaluation devices were prepared with differing film thicknesses of the Ba layer 36. More specifically, the three different film thicknesses of the Ba layer 36 were 3 nm, 5 nm and 10 nm.

Due to equipment used in manufacture, a configuration was prepared in which the common electrode 38 was made of ITO, and the Ba layer 36 was included between the light-emitting layer 35 and the organic electron transport layer 37. The above differs from a configuration in which a common electrode is made of alkali metal or alkaline earth metal, but due to inclusion of the Ba layer 36 above the light-emitting layer 35, the above configuration can be regarded as being effectively the same as a configuration in which a common electrode made of alkali metal or alkaline earth metal is located above a light-emitting layer. Therefore, through the above configuration it is possible to acquire an understanding of properties in a similar configuration in which a common electrode is made of alkali metal or alkaline earth metal.

For purposes of comparison, a comparative device was prepared with the same configuration as the evaluation device 30, but not including the Ba layer 36.

During testing, effects of a Ba layer were investigated through comparison of the evaluation devices 30 which each included the Ba layer 36, and the comparative device which did not include a Ba layer.

[Testing and Results]

Figure 7A:
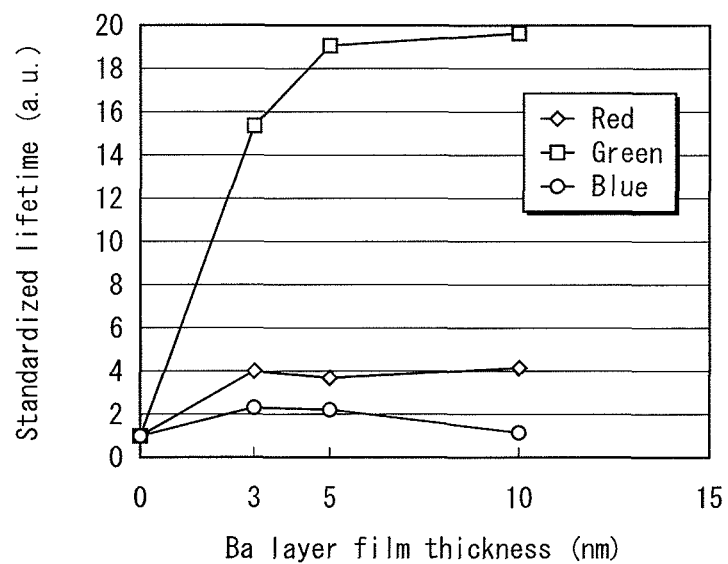
FIG. 7A illustrates a relationship between Ba layer film thickness and standardized lifetime.

FIG. 7A illustrates a relationship between Ba layer film thickness and standardized lifetime. In FIG. 7A standardization was performed by setting a value of 1 for lifetime when Ba layer film thickness was 0 nm (in other words, for the comparative device which did not include a Ba layer). In FIG. 7A standardized lifetime (arbitrary units; a.u.) is indicated on a vertical axis and Ba layer film thickness (nm) is indicated on a horizontal axis.

In the case of green light-emission, when Ba layer film thickness was increased from 0 nm to 3 nm there was a large increase in standardized lifetime. There was also an increase in standardized lifetime when Ba layer film thickness was increased from 3 nm to 5 nm, and when Ba layer film thickness was increased from 5 nm to 10 nm. However, an amount of increase in standardized lifetime achieved when Ba layer film thickness was increased from 3 nm to 5 nm was less than when Ba film thickness was increased from 0 nm to 3 nm, and an amount of increase in standardized lifetime achieved when Ba film thickness was increased from 5 nm to 10 nm was even less. The above results can be summarized as indicating that in the case of green light-emission, standardized lifetime increases as Ba layer film thickness increases, but the rate of increase of standardized lifetime is slower at higher Ba layer film thicknesses.

In the case of red light-emission, when Ba layer film thickness was increased from 0 nm to 3 nm there was an increase in standardized lifetime. However, an amount of increase was small compared to in the case of green light-emission. When Ba layer film thickness was increased to greater than 3 nm standardized lifetime remained roughly the same as when Ba layer film thickness was 3 nm.

In the case of blue light-emission, when Ba layer film thickness was increased from 0 nm to 3 nm there was an increase in standardized lifetime. However, an amount of increase was small compared to in the case of red light-emission. When Ba layer film thickness was increased from 3 nm to 5 nm, standardized lifetime remained roughly the same, and when Ba layer film thickness was increased from 5 nm to 10 nm standardized lifetime decreased. A main cause of the decrease in standardized lifetime may be due to reduction in light extraction efficiency.

To summarize the above results, in the case of green light-emission and red light-emission standardized lifetime was longer in configurations including a Ba layer than in the comparative device which did not include a Ba layer, regardless of thickness of the Ba layer. On the other hand, in the case of blue light-emission standardized lifetime was longer in configurations including a Ba layer of film thickness 3 nm or 5 nm than in the comparative device which did not include a Ba layer, but standardized lifetime did not change significantly, relative to the comparative device, in a configuration including a Ba layer of film thickness 10 nm.

Consequently, although standardized lifetime is not necessarily improved in all cases compared to a configuration in which a Ba layer is not included, when considering overall effect on a device which emits red, green and blue light, inclusion of a Ba layer is likely to increase standardized lifetime. In other words, a configuration in which a Ba layer is located on a light-emitting layer has a longer standardized lifetime than a configuration in which an organic electron transport layer is located on a light-emitting layer.

Based on the above, the configuration in which the common electrode 109 made of alkali metal or alkaline earth metal is located on the light-emitting layer portions 108 can be considered to increase lifetime of the light-emitting layer portions 108, compared to an electron injection structure in which an organic electron transport layer is located on a light-emitting layer.

Figure 7B:
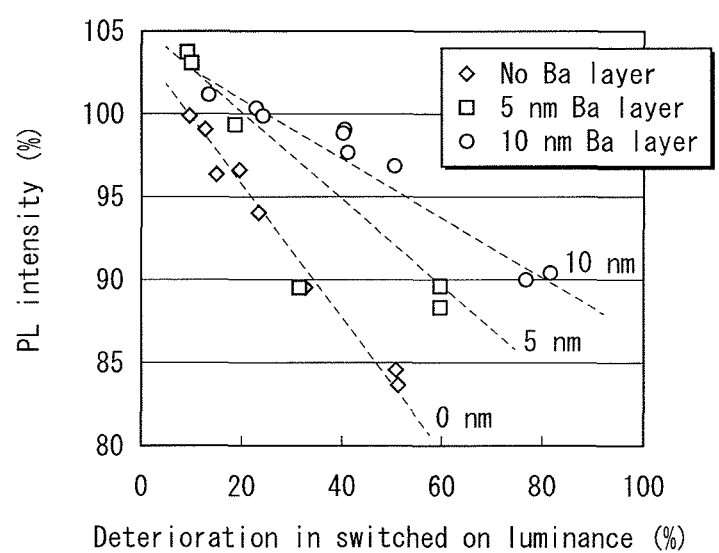
FIG. 7B illustrates a relationship between deterioration in switched on luminance and photoluminescence (PL) intensity.

FIG. 7B illustrates a relationship between deterioration in switched on luminance and PL intensity. FIG. 7B illustrates a case in which a Ba layer was not included, a case in which Ba layer film thickness was 5 nm, and a case in which Ba layer film thickness was 10 nm. In FIG. 7B, PL intensity (%) is illustrated on a vertical axis and deterioration in switched on luminance (%) is illustrated on a horizontal axis. The following explains measurement of deterioration in switched on luminance. Light intensity due to excitation by UV light was measured prior to driving. Next, luminance was caused to deteriorate by driving using a constant electrical current. Once luminance had deteriorated by a certain proportion, the electrical current was stopped, and light intensity due to excitation by UV light was measured again. A rate of decrease in light intensity due to excitation by UV light was calculated by setting light intensity due to excitation by UV light prior to driving (i.e. while deterioration was 0%) as a value of 1 (intensity of 100%).

As deterioration in switched on luminance occurs, PL intensity decreases. As illustrated in FIG. 7B, when Ba layer film thickness was increased, reduction in PL intensity was suppressed relative to deterioration in switched on luminance. Furthermore, as deterioration in switched on luminance increased, difference between decrease in PL intensity for different Ba layer film thicknesses increased.

Based on the above, it can be concluded that decrease in PL intensity can be suppressed through inclusion of a Ba layer, and can be further suppressed by increasing film thickness of the Ba layer. In other words, through the configuration in which the common electrode 109 is located above the light-emitting layer portions 108, decrease in PL intensity can be suppressed, and lifetime of the light-emitting layer portions 108 can be increased.

Although the EL display device relating to the present invention was explained based on the embodiment described above, the present invention is of course not limited to the embodiment described above.

First Modified Example

The following explains a modified example in which an intermediate layer is located between a common electrode and a hole injection layer, above electrical supply wiring.

In the EL display panel 10 illustrated in FIG. 2, the electrical supply wiring 104 and the common electrode 109 are in electrical connection via the hole injection layer 105. Also, the common electrode 109 is made of alkali metal or alkaline earth metal. When the hole injection layer 105 is made of metal oxide including a transition metal oxide such as $WO_x$, $MoO_x$, or $Mo_xW_yO_z$, oxidization of the common electrode 109 may occur through the common electrode 109 stripping oxygen from the hole injection layer 105 due to a difference in electronegativity of the common electrode 109 and the hole injection layer 105. Through the above, the common electrode 109 is converted to an oxide insulator, and thus the problem of voltage drop may occur in the common electrode 109. One strategy for responding to the above problem is to remove the oxide insulator from the common electrode 109 through photo-lithography. However, the aforementioned strategy is undesirable from a point of view of production cost.

The present modified example aims to solve the above problem through an intermediate layer located between the common electrode 109 and the hole injection layer 105, above the electrical supply wiring 104.

Figure 8:
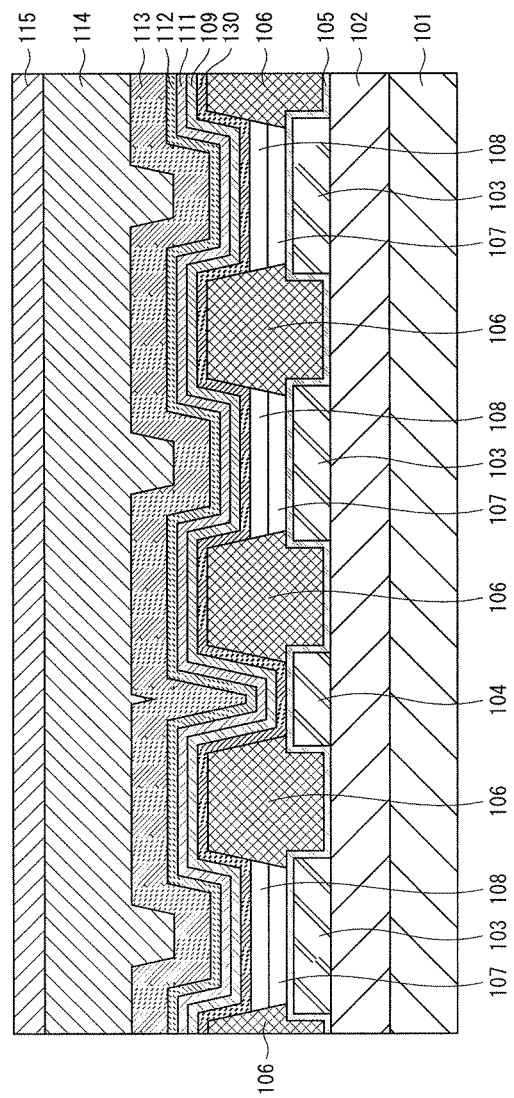

FIG. 8 is a partial cross-sectional diagram that schematically illustrates configuration of an EL display panel 10a. The EL display panel 10a has the same configuration as the EL display panel 10, except for in terms of an intermediate layer 130 which is additionally included in the EL display panel 10a. Therefore, explanation focuses on differences compared to the EL display panel 10, and explanation of configuration elements which are the same as in the EL display panel 10 is omitted.

In the EL display panel 10a, the intermediate layer 130 is located between the light-emitting layer portions 108 and the common electrode 109. The intermediate layer 130 is also located between the electrical supply wiring 104 and the common electrode 109 (more specifically, between the hole injection layer 105 and the common electrode 109, above the electrical supply wiring 104). In the structure described above, the hole injection layer 105 is located between the electrical supply wiring 104 and the intermediate layer 130.

The intermediate layer 130 includes alkali metal or alkaline earth metal. More specifically, the intermediate layer 130 is made of a base material doped with alkali metal or alkaline earth metal. The base material is an organic material which has a property of electron transport. The alkali metal or alkaline earth metal included in the intermediate layer 130 may be the same as used to configure the common electrode 109. Preferably the intermediate layer 130 should have an alkali metal concentration or an alkaline earth metal concentration of at least 10% by weight.

The intermediate layer 130 is at least located between the common electrode 109 and the hole injection layer 105 in a region above the electrical supply wiring 104. However, the intermediate layer 130 may also be located between the light-emitting layer portions 108 and the common electrode 109 as illustrated in FIG. 8. The hole injection layer 105 and the intermediate layer 130 are each formed continuously in and between first openings in which the light-emitting layer portions 108 are located and a second opening in which the electrical supply wiring 104 is located.

The common electrode 109 and the hole injection layer 105 are separated from one other by the intermediate layer 130 which is located therebetween. Although the intermediate layer 130 includes alkali metal or alkaline earth metal, the alkali metal or alkaline earth metal is included in the organic material which is the base material of the intermediate layer 130. Therefore, the intermediate layer 130 has a lower tendency to be oxidized than the common electrode 109, which is made of alkali metal or alkaline earth metal. Therefore, alkali metal or alkaline earth metal oxidization is comparatively suppressed, preventing voltage drop in the common electrode 109, and thus ensuring efficient electrical power supply from the electrical supply wiring 104 to each of the light-emitting layer portions 108.

Other Modified Examples (1) In the above embodiment and modified example a top-emission EL display device was explained, but the present invention may also be applied to a bottom-emission EL display device.

Figure 9:
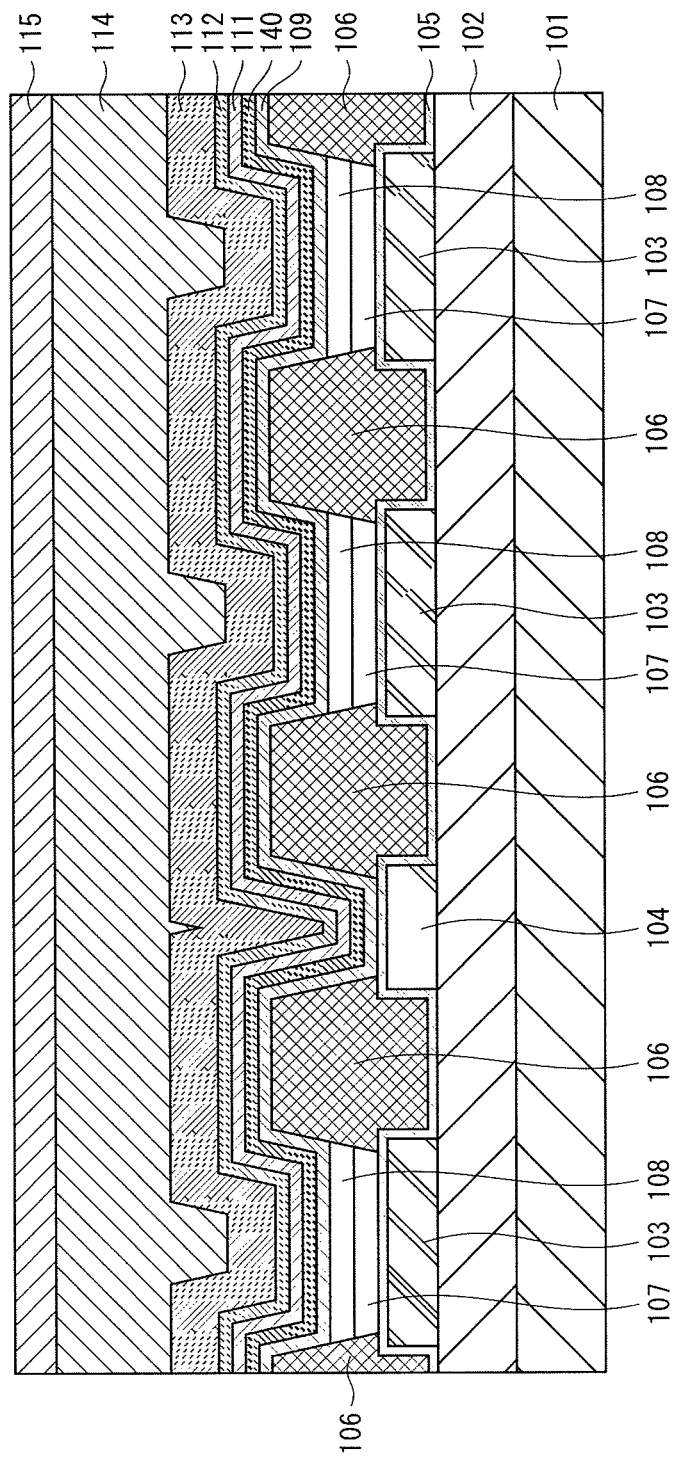
FIG. 9 is a partial cross-sectional diagram that schematically illustrates configuration of an EL display panel 10b.
Figure 10:
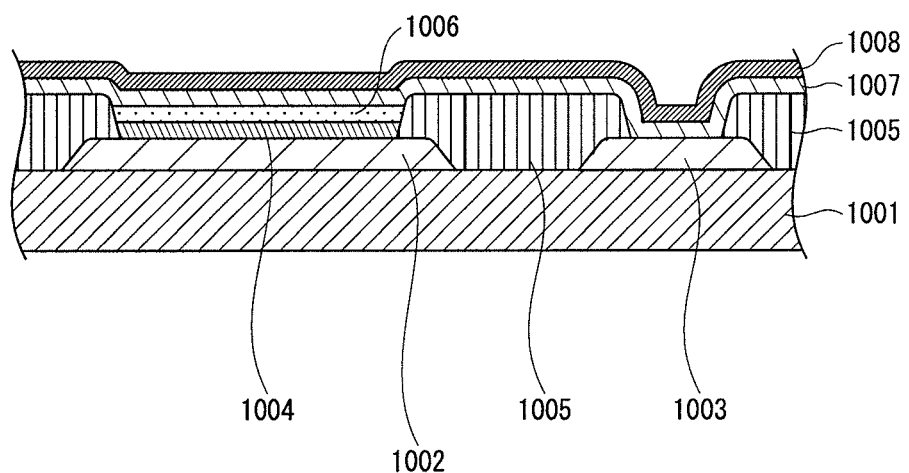
FIG. 10 is a partial cross-sectional diagram that schematically illustrates main components of a display device 1000.

FIG. 9 is a partial cross-sectional diagram that schematically illustrates configuration of an EL display panel 10b, which is a bottom-emission EL display panel. The EL display panel 10b has the same configuration as the EL display panel 10, except for in terms of material used to form pixel electrodes and additional inclusion of a reflective layer in the EL display panel 10b. Therefore, explanation focuses on differences compared to the EL display panel 10, and explanation of configuration elements in FIG. 9 which are the same as in the EL display panel 10 is omitted.

Pixel electrodes 103 are each made of a transparent conductive material such as ITO.

A reflective layer 140 is made of a reflective conductive material such as aluminum.

Through a configuration such as described above, the EL display panel 10b, which is a bottom-emission EL display panel, can achieve the same effects as the EL display panel 10, which is a top-emission EL display panel.

In other words, in the EL display panel 10b which is a bottom-emission EL display panel, the common electrode 109 is made of alkali metal or alkaline earth metal, and the protective layer 120 is located above the common electrode 109. The protective layer 120 suppresses oxidization of the common electrode 109, maintaining conductivity of the common electrode 109. Therefore, voltage drop in the common electrode 109 can be effectively suppressed. Furthermore, formation of alkali metal oxide or alkaline earth metal oxide between the common electrode 109 and the electrical supply wiring 104 can be prevented, and consequently low contact resistance can be maintained between the common electrode 109 and the electrical supply wiring 104.

Also, the above configuration does not include a layered structure of an organic electron transport layer and an ITO layer as an electron injection structure. Therefore, a problem of formation of alkali metal oxide or alkaline earth metal oxide at an interface between the organic electron transport layer and the ITO layer can be avoided.

Furthermore, the common electrode 109 is formed from alkali metal or alkaline earth metal which has a low work function compared to an oxide conductor. Therefore, configuring the common electrode 109 using alkali metal or alkaline earth metal enables improvement in the property of electron injection to the light-emitting layer portions 108.

As a consequence of the common electrode 109 being located above the light-emitting layer portions 108, lifetime of the light-emitting layer portions 108 can be increased, and reduction in PL intensity can be suppressed.

(2) The protective layer 120 was explained as including the organic material sub-layer 111, the oxidized protective sub-layer 112, the sealing sub-layer 113 and the resin sealing sub-layer 114, but inclusion of the resin sealing sub-layer 114 is not essential.

(3) The electrical supply wiring 104 may alternatively be located on the banks 106.

(4) FIG. 2 illustrates a configuration in which the hole injection layer 105 is located over all of the pixel electrodes 103 and the electrical supply wiring 104, but it is not essential that the hole injection layer 105 is located over all of the pixel electrodes 103 and the electrical supply wiring 104. For example, alternatively part of the hole injection layer may be non-continuous. Also, inclusion of the hole injection layer 105 is not essential.

INDUSTRIAL APPLICABILITY

The present invention is widely applicable for use in an EL display device.

REFERENCE SIGNS LIST

1 EL display device
10, 10a, 10b EL display panel
20 drive controller
21-24 drive circuit
25 control circuit
101 TFT substrate
102 inter-layer insulating film
103 pixel electrode
104 electrical supply wiring
105 hole injection layer
106 bank
107 hole transport layer portion
108 light-emitting layer portion
109 common electrode
111 organic material sub-layer
112 oxidized protective sub-layer
113 sealing sub-layer
114 resin sealing sub-layer
115 sealing glass
120 protective layer
130 intermediate layer
140 reflective layer

The invention claimed is:

1. An electroluminescence (EL) display device comprising:
    a substrate;
    a plurality of pixel electrodes located on the substrate with intervals therebetween;
    wiring located on the substrate in at least one of the intervals between the pixel electrodes;
    a hole injection layer located on or above at least the pixel electrodes and the wiring;
    banks located above the substrate with openings therebetween, the openings corresponding to the pixel electrodes and the wiring, at least a portion of at least one of the banks being above a portion of the hole injection layer, the portion of the at least one of the banks and the portion of the hole injection layer overlapping with each other in a plan view;
    a plurality of light-emitting layer portions, each located in one of the openings on or above a corresponding one of the pixel electrodes in electrical connection therewith;
    an intermediate layer located at least in one of the openings on or above the wiring;
    a common electrode located on or above the light-emitting layer portions, and in electrical connection with the light emitting layer portions and the wiring, the intermediate layer and the hole injection layer being between the common electrode and the wiring; and
    a protective layer located on or above the common electrode, and preventing oxidization of the common electrode, wherein
    the common electrode is made of alkali metal or alkaline earth metal, and
    the intermediate layer is made of a base material and one of an alkali metal or alkaline earth metal for having a lower oxidization potential than the common electrode to prevent voltage drop in the common electrode.

2. The EL display device of claim 1, wherein the intermediate layer is further located between the light-emitting layer portions and the common electrode.

3. The EL display device of claim 2, wherein the wiring and the pixel electrodes are located on a same surface of the substrate.

4. The EL display device of claim 3, wherein
the hole injection layer is a metal oxide layer including a transition metal, located between each of the pixel electrodes and a corresponding one of the light-emitting layer portions, and
the metal oxide layer is also located between the wiring and the intermediate layer.

5. The EL display device of claim 2, wherein the intermediate layer is made of the base material doped with the one of alkali metal or alkaline earth metal, the base material being an organic material having an electron transport property.

6. The EL display device of claim 2, wherein the intermediate layer has an alkali metal concentration or an alkaline earth metal concentration of at least 10% by weight.

7. The EL display device of claim 1, wherein
the protective layer has a multi-layer structure including a plurality of sub-layers, and
a lowermost sub-layer of the protective layer is made of an organic material.

8. The EL display device of claim 7, wherein in the protective layer, an oxidized protective sub-layer made of alkali metal oxide or alkaline earth metal oxide is located on the lowermost sub-layer.

9. The EL display device of claim 8, wherein in the protective layer, a sealing sub-layer is located on the oxidized protective sub-layer.

10. The EL display device of claim 1, wherein the hole injection layer is a metal oxide layer including a transition metal, located between each of the pixel electrodes and a corresponding one of the light-emitting layer portions.

11. The EL display device of claim 10, wherein the transition metal is at least one selected from the group consisting of Mo, W, Ti, In, Sn and Zn.

12. The EL display device of claim 1, wherein the hole injection layer extends continuously on or above the pixel electrodes and the intervals therebetween, including on or above the wiring.

13. A method for manufacturing an electroluminescence (EL) display device, comprising:
    forming an insulating layer on a TFT substrate;
    forming a plurality of pixel electrodes and wiring on the insulating layer, separated from one another with intervals therebetween;
    forming a hole injection layer on or above the pixel electrodes and the wiring, after the forming of the pixel electrodes and the wiring;
    forming banks above the insulating layer after the forming of the hole injection layer, such that first openings are formed between the banks in locations corresponding to the pixel electrodes and a second opening is formed between the banks in a location corresponding to the wiring;
    forming a light-emitting layer portion on or above each of the pixel electrodes, which are each between the banks in a corresponding one of the first openings;

forming an intermediate layer on or above at least the wiring;

forming a common electrode using alkali metal or alkaline earth metal, on or above each of the light-emitting layer portions and above the wiring, the wiring being between the banks in the second opening, the intermediate layer and the hole injection layer being between the common electrode and the wiring; and forming a protective layer that prevents oxidization of the common electrode on or above the common electrode, wherein the intermediate layer is made of a base material and one of an alkali metal or alkaline earth metal for having a lower oxidization potential than the common electrode to prevent voltage drop in the common electrode.

14. The method for manufacturing an EL display device of claim 13, wherein
the hole injection layer includes an oxide of at least one selected from the group consisting of Mo, W, Ti, In, Sn and Zn.

15. The method for manufacturing an EL display device of claim 13, further comprising
forming the intermediate layer on or above the light-emitting layer portions, after the forming of the light-emitting layer portions, and before the forming of the common electrode.

16. The method for manufacturing an EL display device of claim 15, wherein
in the forming of the intermediate layer, the intermediate layer is formed from the base material doped with the one of alkali metal or alkaline earth metal, the base material being an organic material having an electron transport property.

17. The method for manufacturing an EL display device of claim 15, wherein
in the forming of the intermediate layer, the intermediate layer is formed such that an alkali metal concentration or an alkaline earth metal concentration of the intermediate layer is at least 10% by weight.

18. The method for manufacturing an EL display device of claim 15, wherein
the hole injection layer and the intermediate layer are each formed continuously in and between each of the first openings and the second opening.

19. The method for manufacturing an EL display device of claim 13, wherein
the protective layer has a multi-layer structure including a plurality of sub-layers, and
in the forming of the protective layer, an organic material sub-layer is formed on or above the common electrode as a lowermost sub-layer of the protective layer.

20. The method for manufacturing an EL display device of claim 19, wherein
in the forming of the protective layer, an oxidized protective sub-layer made of alkali metal oxide or alkaline earth metal oxide is formed on the organic material sub-layer.

21. The method for manufacturing an EL display device of claim 20, wherein
in the forming of the protective layer, a sealing sub-layer is formed on the oxidized protective sub-layer.

* * * * *